(12) United States Patent
Jin

(10) Patent No.: US 11,903,259 B2
(45) Date of Patent: Feb. 13, 2024

(54) FLEXIBLE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Jiangjiang Jin, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 867 days.

(21) Appl. No.: 16/966,035

(22) PCT Filed: Apr. 2, 2020

(86) PCT No.: PCT/CN2020/083082
§ 371 (c)(1),
(2) Date: Jul. 30, 2020

(87) PCT Pub. No.: WO2021/168992
PCT Pub. Date: Sep. 2, 2021

(65) Prior Publication Data
US 2023/0157078 A1 May 18, 2023

(30) Foreign Application Priority Data
Feb. 24, 2020 (CN) .......................... 202010111845.3

(51) Int. Cl.
*H01L 21/00* (2006.01)
*H10K 59/122* (2023.01)
(Continued)

(52) U.S. Cl.
CPC ......... *H10K 59/122* (2023.02); *H10K 50/858* (2023.02); *H10K 71/13* (2023.02)

(58) Field of Classification Search
CPC ..... H10K 59/122; H10K 71/13; H10K 50/858
See application file for complete search history.

(56) References Cited

U.S. PATENT DOCUMENTS

2016/0240589 A1 8/2016 Jeong
2017/0271413 A1* 9/2017 Liao ..................... H10K 59/131
(Continued)

FOREIGN PATENT DOCUMENTS

CN  103165680 A  6/2013
CN  106684256 A  5/2017
(Continued)

*Primary Examiner* — Richard A Booth
(74) *Attorney, Agent, or Firm* — PV IP PC; Wei Te Chung; Zhigang Ma

(57) ABSTRACT

A flexible display panel is provided. The flexible display panel includes an array substrate, an organic light-emitting layer, a cathode layer, an optical coupling output layer, and a thin film encapsulation layer stacked on each other. The organic light-emitting layer includes a red pixel unit, a green pixel unit, and a blue pixel unit. The optical coupling output layer is arranged corresponding to the red pixel unit and the green pixel unit. The thin film encapsulation layer corresponding to the blue pixel unit of the organic light-emitting layer is in contact with the cathode layer.

10 Claims, 3 Drawing Sheets

(51) Int. Cl.
*H10K 71/13* (2023.01)
*H10K 50/858* (2023.01)

(56) References Cited

U.S. PATENT DOCUMENTS

2019/0067394 A1 2/2019 Cheon
2020/0321560 A1 10/2020 Wang

FOREIGN PATENT DOCUMENTS

| CN | 107123751 A | 9/2017 |
| CN | 107180847 A | 9/2017 |
| CN | 107359266 A | 11/2017 |
| CN | 107565038 A | 1/2018 |
| CN | 109686864 A | 4/2019 |
| CN | 110649078 A | 1/2020 |
| CN | 110707146 A | 1/2020 |

* cited by examiner

FLEXIBLE DISPLAY PANEL

1. FIELD OF DISCLOSURE

The present invention relates to a field of display panels and in particular, to a flexible display panel.

2. DESCRIPTION OF RELATED ART

Organic light-emitting diodes (OLED) have advantages such as a high contrast ratio, fast response speed, self-luminescence, and operation in a wide temperature range. Therefore, they have gradually become a mainstream in the small-size display industry. However, as products have to meet requirements at higher level, it is difficult to satisfy the demands by only the above advantages/characteristics. Furthermore, liquid crystal displays and quantum dot light-emitting diode technology are also improving, which brings many challenges to the development of OLED.

Compared with other display technologies, flexible OLEDs more easily achieve flexible display, while it is difficult to achieve by other technologies, but OLED also has its own shortcomings. For example, because OLED luminescent materials are currently subject to an organic small molecule evaporation process, its service life is much shorter than that of a liquid crystal display. OLED lifespans are limited by factors such as the material itself, evaporation conditions, and operating voltages. Therefore, it is necessary to comprehensively consider the efficiency and service lives of red, green, and blue light-emitting materials so as to optimize the efficiency and lower power consumption of light-emitting elements.

Therefore, there is an urgent need to improve the luminous efficiency of flexible organic light-emitting diode display panels and reduce power consumption.

SUMMARY

The present invention provides a flexible display panel whose structure can ensure the maximum efficiency of red and green light, and at the same time can also effectively improve the efficiency of blue light, simplify an evaporation process, and reduce the production costs.

Accordingly, the present invention provides a flexible display panel. The flexible display panel comprises an array substrate, an organic light-emitting layer, a cathode layer, an optical coupling output layer, and a thin film encapsulation layer. The array substrate is provided with an anode layer. The organic light-emitting layer is disposed on the anode layer and comprises a red pixel unit, a green pixel unit, and a blue pixel unit. The cathode layer is disposed on the organic light-emitting layer. The optical coupling output layer is disposed on the cathode layer and arranged corresponding to the red pixel unit and the green pixel unit of the organic light-emitting layer. The thin film encapsulation layer is disposed on the optical coupling output layer. The thin film encapsulation layer corresponding to the blue pixel unit of the organic light-emitting layer is in contact with the cathode layer.

Furthermore, the optical coupling output layer is produced by evaporation deposition or by printing a small molecule organic material.

Furthermore, the thin film encapsulation layer comprises a first inorganic barrier layer, an organic barrier layer, and a second inorganic barrier layer. The first inorganic barrier layer is disposed on the optical coupling output layer and the cathode layer corresponding to the blue pixel unit. The organic barrier layer is disposed on the first inorganic barrier layer. The second inorganic barrier layer is disposed on the organic barrier layer.

Furthermore, the first inorganic barrier layer comprises a first inorganic layer and a second inorganic layer. The first inorganic layer has a refractive index greater than or equal to 1.76 and less than or equal to 2. The second inorganic layer is disposed on the first inorganic layer, and a water vapor transmission rate of the second inorganic layer is less than $1 \times 10^{-4}$ g/(m$^2 \cdot$24 h).

Furthermore, material of the first inorganic layer comprises any one of SiNx, SiONx, TiOx, or ZnOx.

Furthermore, material of the second inorganic layer comprises any one of SiNx, SiONx, SiOx, Al$_2$O$_3$, TiOx, ZrO$_2$, or ZnOx.

Furthermore, the first inorganic barrier layer comprises a third inorganic layer disposed between the first inorganic layer and the second inorganic layer, and a refractive index of the third inorganic layer is less than or equal to 1.55.

Furthermore, material of the third inorganic layer comprises SiOx, SiONx, or organic aluminide.

Furthermore, the first inorganic barrier layer comprises a fourth inorganic layer disposed on the second inorganic layer, and a refractive index of the fourth inorganic layer is less than or equal to 1.55.

Furthermore, material of the fourth inorganic layer comprises SiOx or SiONx.

Advantages of the Present Invention

The present invention provides a flexible display panel. By not arranging the optical coupling output layer at a position corresponding to the blue pixel unit, power consumption is reduced, and a service life of the flexible display panel is prolonged. Moreover, the first inorganic barrier layer of the thin film encapsulation layer completely replaces the optical coupling output layer at the position corresponding to the blue pixel unit. Therefore, the present invention can not only maximize the efficiency of red and green light, but also effectively improve the efficiency of blue light. Meanwhile, an evaporation process is simplified, and production costs are also reduced.

BRIEF DESCRIPTION OF DRAWINGS

The following detailed description of the present application will make the technical solutions and the advantages of the present application obvious in conjunction with the accompanying drawings and specific embodiments.

DETAILED DESCRIPTION OF EMBODIMENTS

Figure 1:
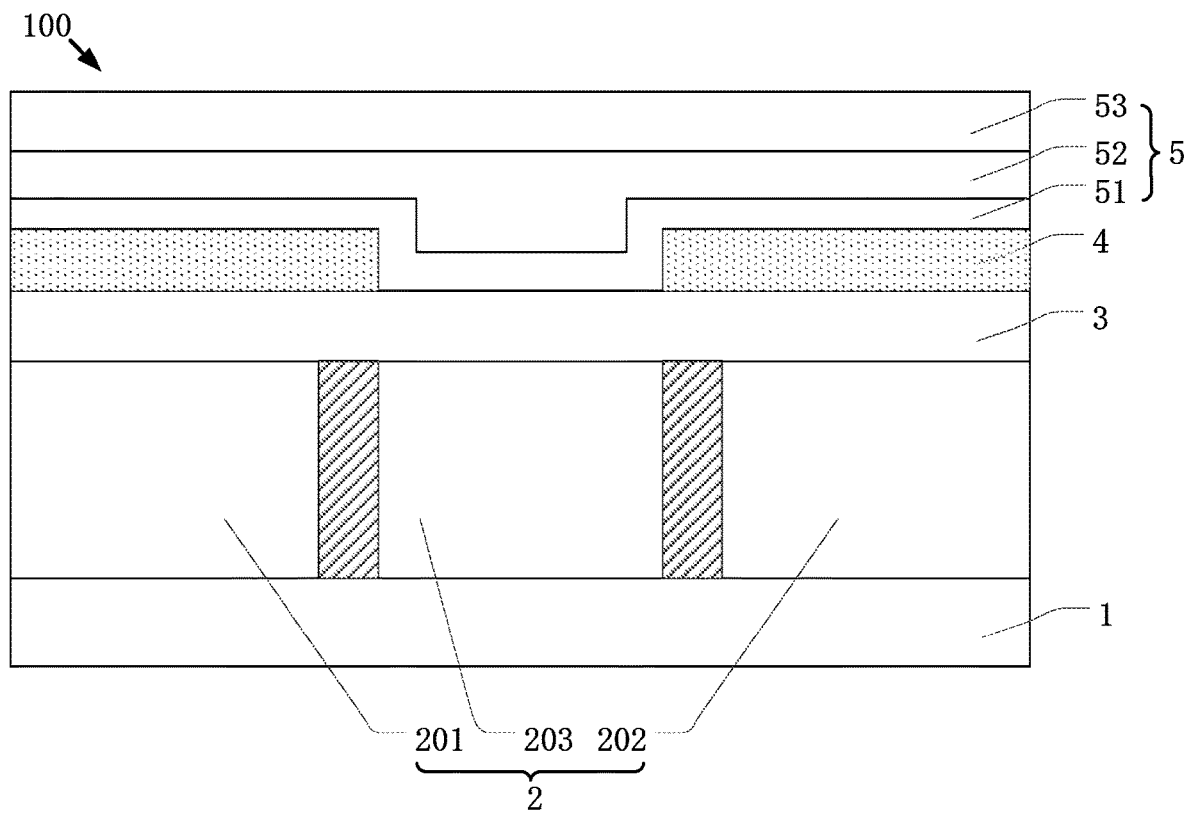
FIG. 1 is a schematic structural view illustrating a flexible display panel according to a first embodiment of the present invention.

The technical solutions of the present application will be clearly and completely described below with reference to the accompanying drawings and embodiments of the present application. Obviously, the described embodiments are only some embodiments of the present application, but not all the embodiments. Based on the embodiments in the present application, all other embodiments obtained by those skilled in the art without creative work fall into the protection scope of the present application.

In the present invention, unless otherwise clearly specified and defined, a first element being "above" or "below" a second element can indicate that the first and second elements are in direct contact with each other, or the first and second elements are not in direct contact but are in contact with another element between them. Moreover, the first element being "above", "over", or "on" the second element can indicate that the first element is right above or obliquely over the second element, or simply means that the first element is disposed at a higher level than the second element. The first element being "under", "below", or "beneath" the second element can indicate that the first element is right under and obliquely below the second element, or simply means that the first element is disposed at a lower level than the second element.

In the present invention, the same or corresponding components are denoted by the same reference numerals regardless of the figure number. In the whole specification, wording like "first" and "second" can be used to describe various components; however, these components are not limited by the above wording. The above wording is only used to distinguish one component from another.

First Embodiment

As shown in FIG. 1, a flexible display panel 100 is provided according to the first embodiment of the present invention. The flexible display panel 100 comprises an array substrate 1, an organic light-emitting layer 2, a cathode layer 3, an optical coupling output layer 4, and a thin film encapsulation layer 5. The array substrate 1 is provided with an anode layer 111. The organic light-emitting layer 2 is disposed on the anode layer 111 and comprises a red pixel unit 201, a green pixel unit 202, and a blue pixel unit 203. The cathode layer 3 is disposed on the organic light-emitting layer 2. The optical coupling output layer 4 is disposed on the cathode layer 3 and arranged corresponding to the red pixel unit 201 and the green pixel unit 202 of the organic light-emitting layer 2. The thin film encapsulation layer 5 is disposed on the optical coupling output layer 4. The thin film encapsulation layer 5 corresponding to the blue pixel unit 203 of the organic light-emitting layer 2 is in contact with the cathode layer 3.

In the present embodiment, the optical coupling output layer 4 is produced by evaporation deposition or by printing a small molecule organic material. The optical coupling output layer 4 is disposed on the cathode layer and arranged only in positions corresponding to the red pixel unit 201 and the green pixel unit 202 of the organic light-emitting layer 2, not in positions corresponding to the blue pixel unit 3.

Figure 2:
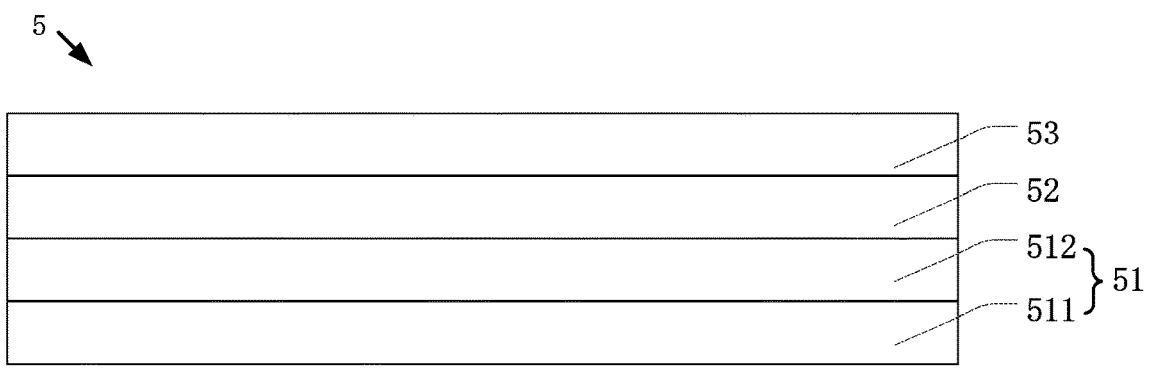
FIG. 2 is a schematic structural view illustrating a thin film encapsulation layer according to the first embodiment of the present invention.

Referring to FIGS. 1 and 2, in the present embodiment, the thin film encapsulation layer comprises a first inorganic barrier layer 51, an organic barrier layer 52, and a second inorganic barrier layer 53. The first inorganic barrier layer 51 is disposed on the optical coupling output layer 4 and the cathode layer 3 corresponding to the blue pixel unit 203. The organic barrier layer 52 is disposed on the first inorganic barrier layer 51. The second inorganic barrier layer 53 is disposed on the organic barrier layer 52.

Referring to FIG. 2, in the present embodiment, the first inorganic barrier layer 51 comprises a first inorganic layer 511 and a second inorganic layer 512. The first inorganic layer 511 has a refractive index greater than or equal to 1.76 and less than or equal to 2. The second inorganic layer 512 is disposed on the first inorganic layer 511, a water vapor transmission rate (WVTR) of the second inorganic layer 512 is less than $1 \times 10^{-4}$ g/(m²·24 h). The first inorganic layer 511 has a high refractive index, which can improve light output efficiency.

In the present embodiment, material of the first inorganic layer 511 comprises any one of SiNx, SiONx, TiOx, or ZnOx, wherein the material is preferably SiNx.

In the present embodiment, material of the second inorganic layer 512 comprises any one of SiNx, SiONx, SiOx, $Al_2O_3$, TiOx, $ZrO_2$, or ZnOx, wherein the material is preferably SiONx.

Figure 3:
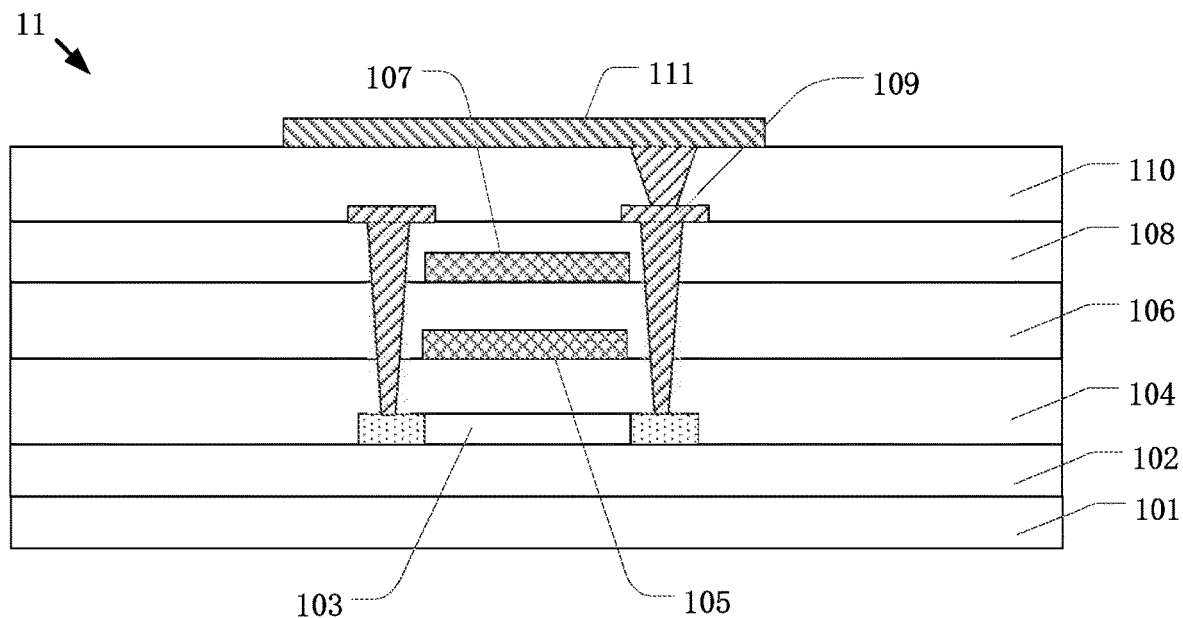
FIG. 3 is a schematic structural view illustrating an array substrate according to the first embodiment.

Referring to FIG. 3, in the present embodiment, the array substrate 11 includes a flexible base substrate layer 101, a buffer layer 102, an active layer 103, a first gate insulating layer 104, a first gate layer 105, a second gate insulating layer 106, a second gate layer 107, an interlayer insulating layer 108, a source/drain layer 109, an organic planarization layer 110, and the anode layer 111. Material of the flexible base substrate layer 101 is polyimide (PI). The buffer layer 102, the first gate insulating layer 104, the second gate insulating layer 106, the interlayer insulating layer 108 are stacked inorganic layers composed of, for example, SiN/SiOx. The active layer 103 is a low-temperature polysilicon layer composed of low-temperature polysilicon. Material of the first gate layer 105 and the second gate layer 107 includes Mo. The source/drain layer 109 has a stacked structure of Ti/Al/Ti, and material of the organic planarization layer 110 includes polyimide, and the anode layer 111 has a stacked structure of ITO/Ag/ITO or IZO/Ag/IZO.

Figure 4:
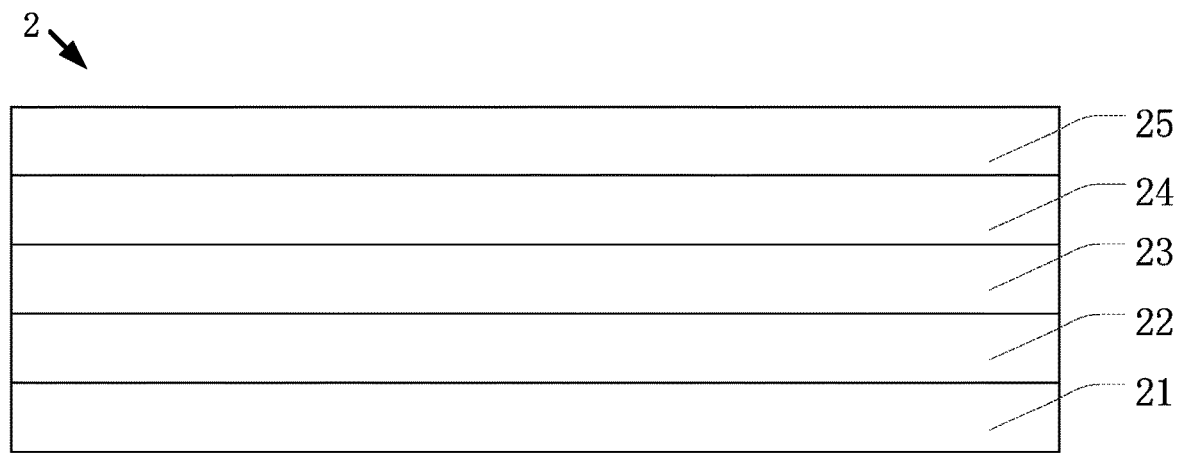
FIG. 4 is a schematic structural view illustrating an organic light-emitting layer according to the first embodiment.

Referring to FIG. 4, in the present embodiment, the organic light-emitting layer 2 includes a hole injection layer 21 (HIL), a hole transport layer 22 (HTL), an organic light-emitting layer 23 (EML), an electron transport layer 24 (ETL), and an electron injection layer 25 (EIL) stacked sequentially from bottom to top. The cathode layer 3 is disposed on the electron injection layer 25.

Second Embodiment

Figure 5:
FIG. 5 is a schematic structural view illustrating the thin film encapsulation layer according to a second embodiment.

As shown in FIG. 5, the second embodiment includes all the technical features of the first embodiment. The difference is that the first inorganic barrier layer 51 in the second embodiment further includes a third inorganic layer 513 disposed between the first inorganic layer 511 and the second inorganic layer 512. A refractive index of the third inorganic layer 513 is less than or equal to 1.55.

In the present embodiment, material of the third inorganic layer 513 includes SiOx, SiONx, or organic aluminide (Alucone), wherein the material is preferably SiOx. By means of having the third inorganic layer 513, water and oxygen can be better blocked.

Third Embodiment

Figure 6:
FIG. 6 is a schematic structural view illustrating the thin film encapsulation layer according to a third embodiment.

As shown in FIG. 6, the third embodiment includes all the technical features of the second embodiment. The difference is that the first inorganic barrier layer 51 in the third embodiment further includes a fourth inorganic layer 514 disposed on the second inorganic layer 512. A refractive index of the fourth inorganic layer 514 is less than or equal to 1.55.

In the present embodiment, material of the fourth inorganic layer 514 includes SiOx or SiONx, wherein the material is preferably SiONx. By means of having the fourth inorganic layer 514, water and oxygen can be better blocked.

The present invention has the following advantages. The present invention provides the flexible display panel 100. The optical coupling output layer 4 is not arranged at a position corresponding to the blue pixel unit 203, so power consumption is reduced, and a service life of the flexible display panel 100 is also prolonged. The first inorganic barrier layer 51 of the thin film encapsulation layer 5 completely replaces the optical coupling output layer 4 at the position corresponding to the blue pixel unit 203. Therefore, the present invention can not only maximize the efficiency of red and green light, but also effectively improve the efficiency of blue light at the same time. Meanwhile, this can also simplify an evaporation process and reduce production costs.

The above is only the preferable embodiment of the present invention. It should be noted that, for those of ordinary skill in the art, changes and modifications can be made based on the working principles of the present invention. Such changes and modifications should be deemed to be within the protection scope of the present invention.

What is claimed is:

1. A flexible display panel, comprising:
   an array substrate;
   an organic light-emitting layer disposed on the array substrate and comprising a red pixel unit, a green pixel unit, and a blue pixel unit;
   a cathode layer disposed on the organic light-emitting layer;
   an optical coupling output layer disposed on the cathode layer and arranged corresponding to the red pixel unit and the green pixel unit of the organic light-emitting layer; and
   a thin film encapsulation layer disposed on the optical coupling output layer, wherein the thin film encapsulation layer corresponding to the blue pixel unit of the organic light-emitting layer is in contact with the cathode layer.

2. The flexible display panel according to claim 1, wherein the optical coupling output layer is produced by evaporation deposition or by printing a small molecule organic material.

3. The flexible display panel according to claim 1, wherein the thin film encapsulation layer comprises:
   a first inorganic barrier layer disposed on the optical coupling output layer and the cathode layer corresponding to the blue pixel unit;
   an organic barrier layer disposed on the first inorganic barrier layer; and
   a second inorganic barrier layer disposed on the organic barrier layer.

4. The flexible display panel according to claim 3, wherein the first inorganic barrier layer comprises:
   a first inorganic layer with a refractive index greater than or equal to 1.76 and less than or equal to 2; and
   a second inorganic layer disposed on the first inorganic layer, a water vapor transmission rate of the second inorganic layer is less than $1 \times 10^{-4}$ g/(m$^2$·24 h).

5. The flexible display panel according to claim 4, wherein material of the first inorganic layer comprises any one of SiNx, SiONx, TiOx, or ZnOx.

6. The flexible display panel according to claim 4, wherein material of the second inorganic layer comprises any one of SiNx, SiONx, SiOx, Al$_2$O$_3$, TiOx, ZrO$_2$, or ZnOx.

7. The flexible display panel according to claim 4, wherein the first inorganic barrier layer comprises:
   a third inorganic layer disposed between the first inorganic layer and the second inorganic layer, and a refractive index of the third inorganic layer is less than or equal to 1.55.

8. The flexible display panel according to claim 7, wherein material of the third inorganic layer comprises SiOx, SiONx, or organic aluminide.

9. The flexible display panel according to claim 4, wherein the first inorganic barrier layer comprises:
   a fourth inorganic layer disposed on the second inorganic layer, and a refractive index of the fourth inorganic layer is less than or equal to 1.55.

10. The flexible display panel according to claim 9, wherein material of the fourth inorganic layer comprises SiOx or SiONx.

* * * * *